US012694916B2

(12) United States Patent
Lee et al.

(10) Patent No.:  US 12,694,916 B2
(45) Date of Patent:  Jul. 28, 2026

(54) NONVOLATILE MEMORY DEVICE, METHOD OF CONTROLLING INITIALIZATION OF NONVOLATILE MEMORY DEVICE, AND STORAGE DEVICE

(71) Applicant: SAMSUNG ELECTRONICS CO., LTD., Suwon-si (KR)

(72) Inventors: Yo Han Lee, Suwon-si (KR); Sang Soo Park, Suwon-si (KR); Jung-Yun Yun, Suwon-si (KR); Jae-Yun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/825,025

(22) Filed: Sep. 5, 2024

(65) Prior Publication Data

US 2025/0157505 A1       May 15, 2025

(30) Foreign Application Priority Data

Nov. 14, 2023    (KR) ........................ 10-2023-0156888

(51) Int. Cl.
  *G11C 29/52*         (2006.01)
  *G11C 7/10*          (2006.01)
(52) U.S. Cl.
  CPC .......... *G11C 7/1069* (2013.01); *G11C 7/1057* (2013.01); *G11C 29/52* (2013.01)
(58) Field of Classification Search
  CPC ...... G11C 29/52; G11C 7/1057; G11C 7/1069

USPC ..................................................... 365/189.011
See application file for complete search history.

(56)           References Cited

U.S. PATENT DOCUMENTS

| | | | |
|---|---|---|---|
| 9,135,181 | B2 | 9/2015 | Eleftheriou et al. |
| 9,196,371 | B2 | 11/2015 | Yamano et al. |
| 9,715,939 | B2 | 7/2017 | Ellis et al. |
| 11,132,312 | B2 | 9/2021 | Kim et al. |
| 2021/0034295 | A1 * | 2/2021 | Shin ....................... G06F 3/0656 |
| 2021/0035650 | A1 * | 2/2021 | Shin ........................ G11C 16/26 |

FOREIGN PATENT DOCUMENTS

| | | |
|---|---|---|
| KR | 10-2016-0109906 A | 9/2016 |
| KR | 10-2021-0014896 A | 2/2021 |

* cited by examiner

*Primary Examiner* — Ly D Pham
(74) *Attorney, Agent, or Firm* — MORGAN, LEWIS & BOCKIUS LLP

(57)           ABSTRACT

A nonvolatile memory device includes a memory cell array configured to store first and second setting data, a page buffer circuit configured to store data of the memory cell array, and a control logic circuit. The control logic circuit is configured to control a sensing operation based on setting data stored in a setting buffer, perform first sensing of the first setting data stored in the memory cell array in a first sensing scheme, and store the sensed first setting data in the page buffer circuit, dump down the first setting data stored in the page buffer circuit into the setting buffer, and perform second sensing of the second setting data stored in the memory cell array in a second sensing scheme based on the first setting data dumped down into the setting buffer, and store the sensed second setting data in the page buffer circuit.

20 Claims, 14 Drawing Sheets

NONVOLATILE MEMORY DEVICE, METHOD OF CONTROLLING INITIALIZATION OF NONVOLATILE MEMORY DEVICE, AND STORAGE DEVICE

CROSS-REFERENCE TO RELATED APPLICATION

This application claims priority under 35 U.S.C. § 119 to Korean Patent Application No. 10-2023-0156888, filed on Nov. 14, 2023 in the Korean Intellectual Property Office, the disclosure of which is incorporated by reference herein in its entirety.

TECHNICAL FIELD

Embodiments of the present disclosure relate to a nonvolatile memory device, a method of controlling initialization of a nonvolatile memory device, and a storage device.

DISCUSSION OF RELATED ART

A nonvolatile memory device includes multiple memory cells that store data.

Setting data is information utilized for an initialization process before an initial operation of the nonvolatile memory device. The setting data may be written to the multiple memory cells. For example, the setting data may be recorded in a distributed manner in multiple mats within the nonvolatile memory device including a memory cell array composed of the multiple mats, or may be recorded only in one mat or some mats.

The initialization process using the setting data of a general nonvolatile memory device begins upon receiving an initialization command from a memory controller. Additionally, a "sensing" operation of reading out the setting data stored in the memory cells and storing the setting data in a page buffer circuit, and a "dump-down" operation of verifying validity of the setting data stored in the page buffer circuit and then storing the setting data, and final processes of setting conditions for operation of the nonvolatile memory device based on the setting data, may be performed. The final processes may include, for example, setting a level of operating voltages and a "WORscan" operation of excluding a buffer of a defective column from a pass/fail operation.

SUMMARY

Embodiments of the present disclosure may provide a nonvolatile memory device and a storage device with improved performance.

Embodiments of the present disclosure may provide a method of efficiently controlling initialization of a nonvolatile memory device.

According to some embodiments of the present disclosure, a nonvolatile memory device includes a memory cell array configured to store first setting data and second setting data, a page buffer circuit configured to store data of the memory cell array, and a control logic circuit configured to control a sensing operation based on setting data stored in a setting buffer. The control logic circuit is further configured to perform first sensing of the first setting data stored in the memory cell array in a first sensing scheme, and store the sensed first setting data in the page buffer circuit, dump down the first setting data stored in the page buffer circuit into the setting buffer and perform second sensing of the second setting data stored in the memory cell array in a second sensing scheme different from the first sensing scheme based on the first setting data dumped down into the setting buffer, and store the sensed second setting data into the page buffer circuit.

According to some embodiments of the present disclosure, a method of controlling initialization of a nonvolatile memory device includes selecting a first sensing scheme, performing first sensing of first setting data stored in a memory cell array in the first sensing scheme, and storing the sensed first setting data in a first page buffer, dumping down the first setting data stored in the first page buffer into a setting buffer, selecting a second sensing scheme different from the first sensing scheme based on the first setting data dumped down into the setting buffer, and performing second sensing of second setting data stored in the memory cell array in the second sensing scheme and storing the sensed second setting data in a second page buffer.

According to some embodiments of the present disclosure, a storage device includes a nonvolatile memory device and a storage controller configured to transmit an initialization command to the nonvolatile memory device. The nonvolatile memory device includes a memory cell array in which first setting data and second setting data are stored, and a control logic circuit configured to control a sensing operation based on setting data stored in a setting buffer. The control logic circuit is further configured to, in response to the initialization command, perform first sensing of the first setting data stored in the memory cell array in a first sensing scheme, and perform second sensing of the second setting data stored in the memory cell array in a second sensing scheme different from the first sensing scheme based on the sensed first setting data.

BRIEF DESCRIPTION OF THE DRAWINGS

The above and other aspects and features of the present disclosure will become more apparent by describing in detail embodiments thereof with reference to the accompanying drawings, in which:

FIG. 7 is a block diagram showing the flow of data according to some embodiments;

FIG. 8 is a block diagram showing the flow of data according to some embodiments;

FIG. 9 is a diagram illustrating an effect of a method of controlling initialization of a nonvolatile memory device according to some embodiments;

FIG. 14 is a block diagram of a storage device including a nonvolatile memory device according to some embodiments.

DETAILED DESCRIPTION OF THE EMBODIMENTS

Figure 1:
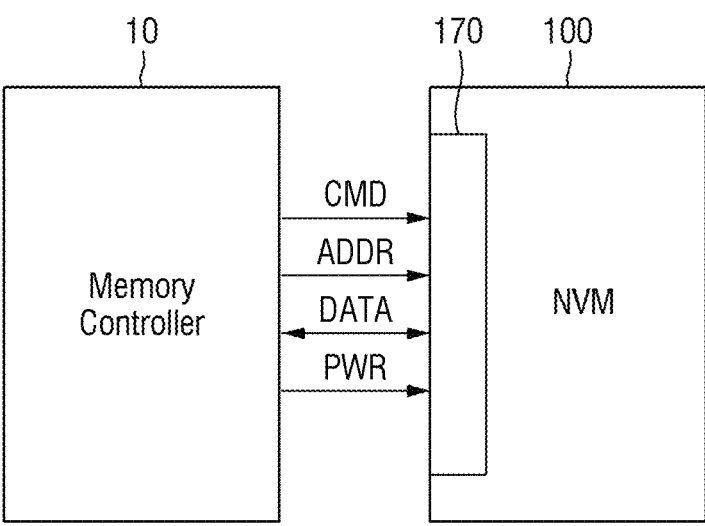
FIG. 1 is a block diagram showing a nonvolatile memory device according to some embodiments.

Embodiments of the present disclosure will be described more fully hereinafter with reference to the accompanying drawings. Like reference numerals may refer to like elements throughout the accompanying drawings.

It will be understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when an element or layer is referred to as being "connected to", or "coupled to" another element or layer, it may be directly connected to or coupled to another element or layer, or one or more intervening elements or layers therebetween may be present. In addition, it will also be understood that when an element or layer is referred to as being "between" two elements or layers, it may be the only element or layer between the two elements or layers, or one or more intervening elements or layers therebetween may also be present. Other words used to describe the relationships between components should be interpreted in a like fashion.

In descriptions of temporal relationships, for example, temporal precedent relationships between two events such as "after", "subsequent to", "before", etc., another event may occur therebetween, unless the context indicates otherwise, e.g., unless terminology such as "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

The features of the various embodiments of the present disclosure may be partially or entirely combined with each other, and may be technically associated with each other or operate with each other. The embodiments may be implemented independently of each other and may be implemented together in an association relationship.

Hereinafter, a nonvolatile memory device, a method of controlling initialization of a nonvolatile memory device, and a storage device according to some embodiments of the present disclosure will be described with reference to the accompanying drawings.

FIG. 1 is a block diagram showing a nonvolatile memory device according to some embodiments.

Referring to FIG. 1, a nonvolatile memory device (NVM) 100 may perform data erase, write, or read-out operations under control of a memory controller 10. The nonvolatile memory device (NVM) 100 may receive a command signal CMD, an address signal ADDR, data DATA, and power PWR from the memory controller 10 through a memory interface circuit 170. The data DATA may be transmitted from the NVM 100 to the memory controller 10. The memory controller 10 may be, for example, a storage controller 210 (see FIG. 14).

Figure 2:
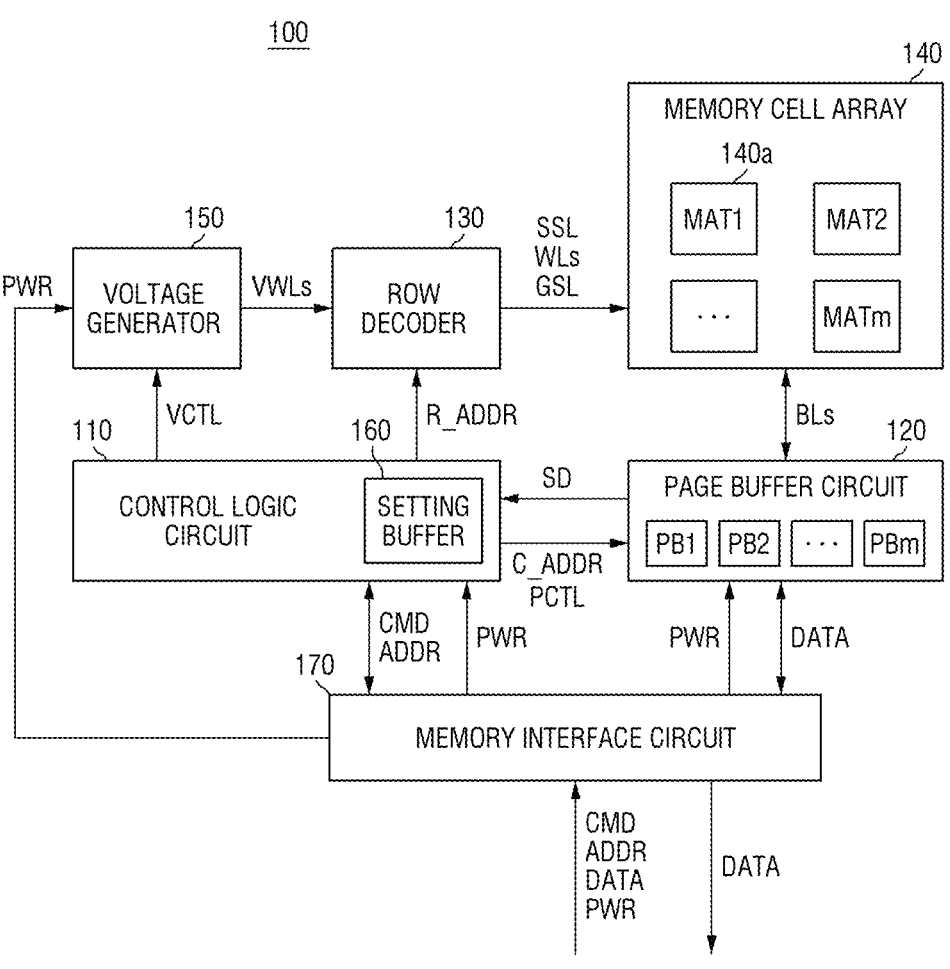
FIG. 2 is an internal block diagram showing a nonvolatile memory device according to some embodiments.

FIG. 2 is an internal block diagram showing a nonvolatile memory device according to some embodiments.

The nonvolatile memory device 100 may include a control logic circuit 110, a page buffer circuit 120, a row decoder 130, a memory cell array 140, a voltage generator 150, and a memory interface circuit 170. Further, in some embodiments, the nonvolatile memory device 100 may further include a pre-decoder, a temperature sensor, a command decoder, etc.

The control logic circuit 110 may operate upon receiving the power PWR from the memory controller 10 through the memory interface circuit 170. The control logic circuit 110 may generally control various operations within the nonvolatile memory device 100. The control logic circuit 110 may output various control signals in response to the command CMD and the address ADDR from the memory interface circuit 170. For example, the control logic circuit 110 may output a voltage generator control signal VCTL, a row address R-ADDR, a column address C-ADDR, and a page buffer control signal PCTL.

The control logic circuit 110 may include a setting buffer 160 that dumps down setting data. The setting buffer 160 may be included inside the control logic circuit 110 as shown in FIG. 2. However, embodiments are not limited thereto. For example, in some embodiments, the setting buffer 160 may be located outside the control logic circuit 110. The setting buffer 160 may operate, for example, in an E-FUSE (Electrical Fuse) manner. The E-FUSE manner refers to a manner in which a previously used laser fuse is replaced with an electrical fuse, and various information are stored in a memory cell, and is read out when a memory chip operates, and a corresponding switch is turned on/off to transmit the information.

The page buffer circuit 120 may include a plurality of page buffers PB1 to PBm (where m is a natural number of 2 or more). The plurality of page buffers PB1 to PBm may be connected to memory cells via a plurality of bit lines BLs. The page buffer circuit 120 may receive the power PWR from the memory controller 10 through the memory interface circuit 170. The page buffer circuit 120 may select at least one bit line among the plurality of bit lines BLs in response to the column address C-ADDR.

During a write operation, the page buffer circuit 120 may receive data to be written from the memory interface circuit 170 and apply a bit line voltage corresponding to the data to be written to the selected bit line. During a read-out operation, the page buffer circuit 120 may detect current or voltage of the selected bit line to recognize the data stored in the memory cell, and transmit the recognized data to the memory controller 10 through the memory interface circuit 170. When reading out the setting data, the page buffer circuit 120 may transmit the recognized data to the control logic circuit 110.

When reading out the setting data, the page buffer circuit 120 may perform voltage sensing in which the page buffer circuit 120 determines a state of the memory cell based on the voltage applied to the bit line and reads out the data stored in the memory cell based on the determined state. In addition, when reading out the setting data, the page buffer circuit 120 may perform current sensing in which the page buffer circuit 120 determines a state of the memory cell based on the current flowing through the bit line and reads out the data stored in the memory cell based on the determined state.

To prevent coupling between bit lines in the voltage sensing, all bit lines may be divided into even bit lines and odd bit lines which may be sensed separately from each other. In the current sensing, all bit lines may be sensed at once without considering the coupling between the bit lines. Accordingly, a time utilized for the current sensing may be shorter than a time utilized for the voltage sensing.

In the current sensing, a read margin is increased to accurately detect minute change in the current flowing through the bit line. Additionally, the current flowing in the bit line may be affected by an external condition (PVT variation), and this effect may reduce the read margin. Therefore, the control logic circuit 110 adjusts a sensing operation condition to increase the read margin in the current sensing.

The control logic circuit 110 may adjust the sensing operation condition based on trim information about a sensing speed, that is, trim information for sensing in the current sensing manner. The trim information may include trim information about voltage setting, trim information about sensing timing, or trim information about column repair.

The trim information about the voltage setting may include, for example, trim information about accurate voltage generation of the voltage generator 150 and the page buffer circuit 120, trim information about a read voltage of a selected word line and a voltage of an unselected word line, information about a voltage that drives the page buffer circuit 120 for sensing, information about power for driving the control logic circuit 110 and the page buffer circuit 120, information about pump power utilized for voltage generation of the voltage generator 150 and the page buffer circuit 120, and information about compensation for temperatures of the word lines WLs and the bit lines BLs.

The trim information about the sensing timing may include, for example, information about an in-chip oscillator period for accurate timing operation, information about a time utilized for stabilization of the word lines WLs and the bit lines BLs, information about a sensing timing of the page buffer circuit 120 for stabilizing the bit lines BLs, information about an in-chip oscillator period for stabilizing pump capacity utilized for voltage generation, information about an operation timing of the word lines WLs and the bit lines BLs based on temperature change, and information for determining an order of sensing and dump-down in high-speed sensing (current sensing) after the voltage sensing.

Such trim information may be included in the setting data stored in the memory cell array 140 constituting the non-volatile memory device 100.

The current sensing process of the page buffer circuit 120 may include applying a constant pre-charge voltage to the bit line, measuring a magnitude of the current flowing through the bit line, and then discharging the bit line. Since the voltage sensing of the page buffer circuit 120 is performed in a commonly used sensing scheme, for convenience of explanation, a detailed description thereof will be omitted. In the current sensing, the control logic circuit 110 may provide the page buffer control signal PCTL to the page buffer circuit 120 based on the trim information utilized for current sensing among the setting data dumped down into the setting buffer 160. The page buffer circuit 120 may adjust the voltage to be applied to the bit line and adjust the sensing timing based on the received page buffer control signal PCTL.

The row decoder 130 may be connected to the memory cell array 140 via a string select line SSL, a plurality of word lines WLs, and a ground select line GSL. During the write operation or the read-out operation, the row decoder 130 may select one of the plurality of word lines WLs based on the row address R_ADDR provided from the control logic circuit 110.

The memory cell array 140 may include a different plurality of mats MAT1 to MATm (where m is a natural number of 1 or more) corresponding to the plurality of different page buffers PB1 to PBm (where m is a natural number of 1 or more). Each of the plurality of mats may include a plurality of nonvolatile memory cells connected to a plurality of word lines WLs and a plurality of bit lines BLs. The memory cell array 140 may be connected to the page buffer circuit 120 through the bit lines BLs, and may be connected to the row decoder 130 through the word lines WLs, the string select line SSL, and the ground select line GSL.

The setting data may be stored in the plurality of mats MAT1 to MATm (where m is a natural number of 1 or more). For example, the setting data may be stored in the plurality of mats in a distributed manner. Alternatively, the setting data may be stored only in some of the plurality of mats in a distributed manner or may be stored in only one mat.

Replica setting data may be stored in the plurality of mats MAT1 to MATm (where m is a natural number of 1 or more) and may replace the setting data if a fail occurs during a validity verification process in the dump-down operation of the setting data. Like the setting data, the replica setting data may be stored in the plurality of mats in a distributed manner. Alternatively, the replica setting data may be stored only in some of the plurality of mats in a distributed manner or may be stored in only one mat.

The voltage generator 150 may receive the power PWR from the memory controller 10 through the memory interface circuit 170. The voltage generator 150 may generate voltages for performing the write, read-out, and erase operations using the supplied power PWR. For example, the voltage generator 150 may generate word line voltages VWLs such as write voltage, read-out voltage, write verification voltage, and erase voltage. In addition, in the current sensing, the control logic circuit 110 may provide a voltage generator control signal VCTL to the voltage generator 150 based on the trim information utilized for the current sensing among the setting data dumped down into the setting buffer 160. The voltage generator 150 may adjust the voltage to be applied to the word line and adjust a timing of applying the voltage, based on the received voltage generator control signal VCTL.

Figure 3:
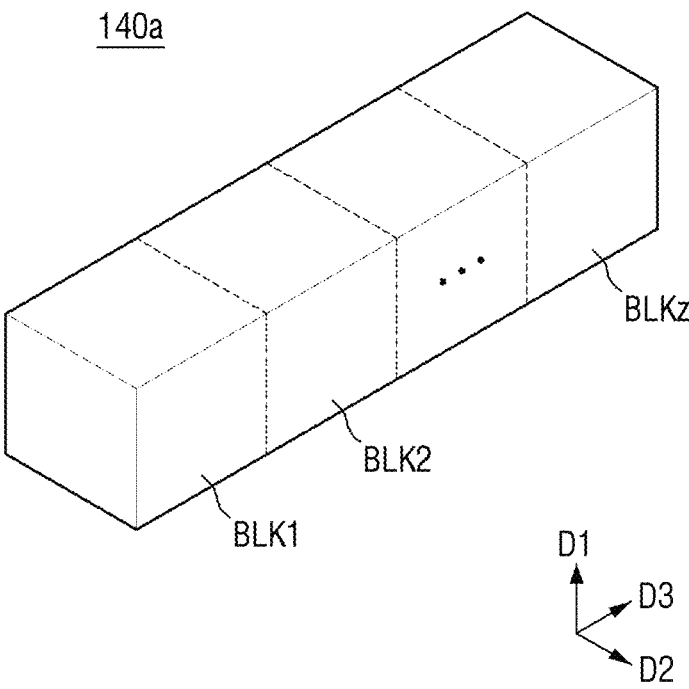
FIG. 3 is an internal block diagram showing a memory cell array according to some embodiments.
Figure 4:
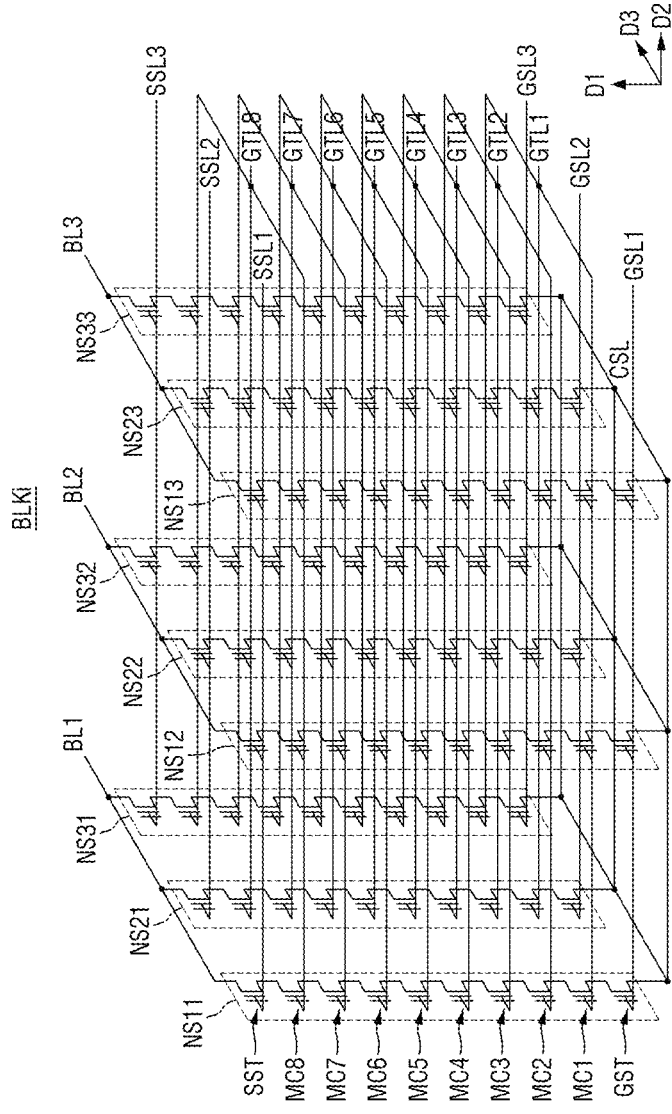
FIG. 4 is an internal circuit diagram showing a memory cell array according to some embodiments.

FIG. 3 is an internal block diagram showing a memory cell array according to some embodiments, and FIG. 4 is an internal circuit diagram showing a memory cell array according to some embodiments.

Each of the plurality of mats may be a unit size generally referred to as a 'plane' where each mat includes a plurality of memory blocks. Alternatively, each of the plurality of mats may be a unit size generally referred to as a 'page' including a plurality of memory cells included in each memory block and sharing one word line. However, embodiments are not limited thereto. For example, in some embodiments, each of the plurality of mats may have a memory unit different from the plane or the page.

Referring to FIG. 3, the memory cell array 140 may include the plurality of mats MAT1 to MATm corresponding to the plurality of page buffers PB1 to PBm. Each of the plurality of mats may include a plurality of memory blocks BLK1 to BLKz. For example, one mat 140a included in the memory cell array 140 may include the plurality of memory blocks BLK1 to BLKz. In this case, the setting data may be stored in the plurality of memory blocks BLK1 to BLKz included in one mat in the distributed manner, or may be stored in the plurality of mats in the distributed manner.

Referring to FIG. 4, an internal structure of one memory block BLKi of the three-dimensional memory blocks BLK1 to BLKz formed in a three-dimensional structure on a substrate is illustrated. For example, each of a plurality of memory NAND strings included in the memory block BLKi may extend in a direction D1 substantially perpendicular to the substrate. An upper surface of the substrate may be substantially perpendicular to a row direction D2 and a column direction D3. Referring to FIG. 4, the memory block BLKi may include a plurality of cell strings, that is, a plurality of memory NAND strings NS11 to NS33 disposed between and connected to bit lines BL1, BL2 and BL3 and a common source line CSL. Each of the plurality of memory NAND strings NS11 to NS33 may include a string selection transistor SST, a plurality of memory cells MC1, MC2, . . . , MC8, and a ground selection transistor GST. FIG. 4 shows an example in which each of the plurality of memory NAND strings NS11 to NS33 includes eight memory cells MC1, MC2, . . . , MC8. However, embodiments of the present disclosure are not limited thereto.

The string select transistor SST may be connected to a corresponding string select line SSL1, SSL2, or SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may act as the word lines. A ground select transistor GST may be connected to a ground select line GSL1, GSL2, or GSL3. The string select transistor SST may be connected to a corresponding bit line BL1, BL2, or BL3, and the ground select transistor GST may be connected to the common source line CSL.

The word lines (for example, GTL1) at the same vertical level may be commonly connected. The ground select lines GSL1, GSL2, and GSL3 at the same vertical level may be separated from each other. The string select lines SSL1, SSL2, and SSL3 at the same vertical level may be separated from each other. Each of the plurality of mats may include a plurality of memory cells that are commonly connected. For example, the first mat 140a may include a plurality of memory cells that are commonly connected to the first gate line GTL1 and share one word line. In this case, the setting data may be stored in the plurality of mats included in one memory block BLKi in the distributed manner. Alternatively, an entirety of the setting data may be stored in one mat included in one memory block BLKi.

Figure 5:
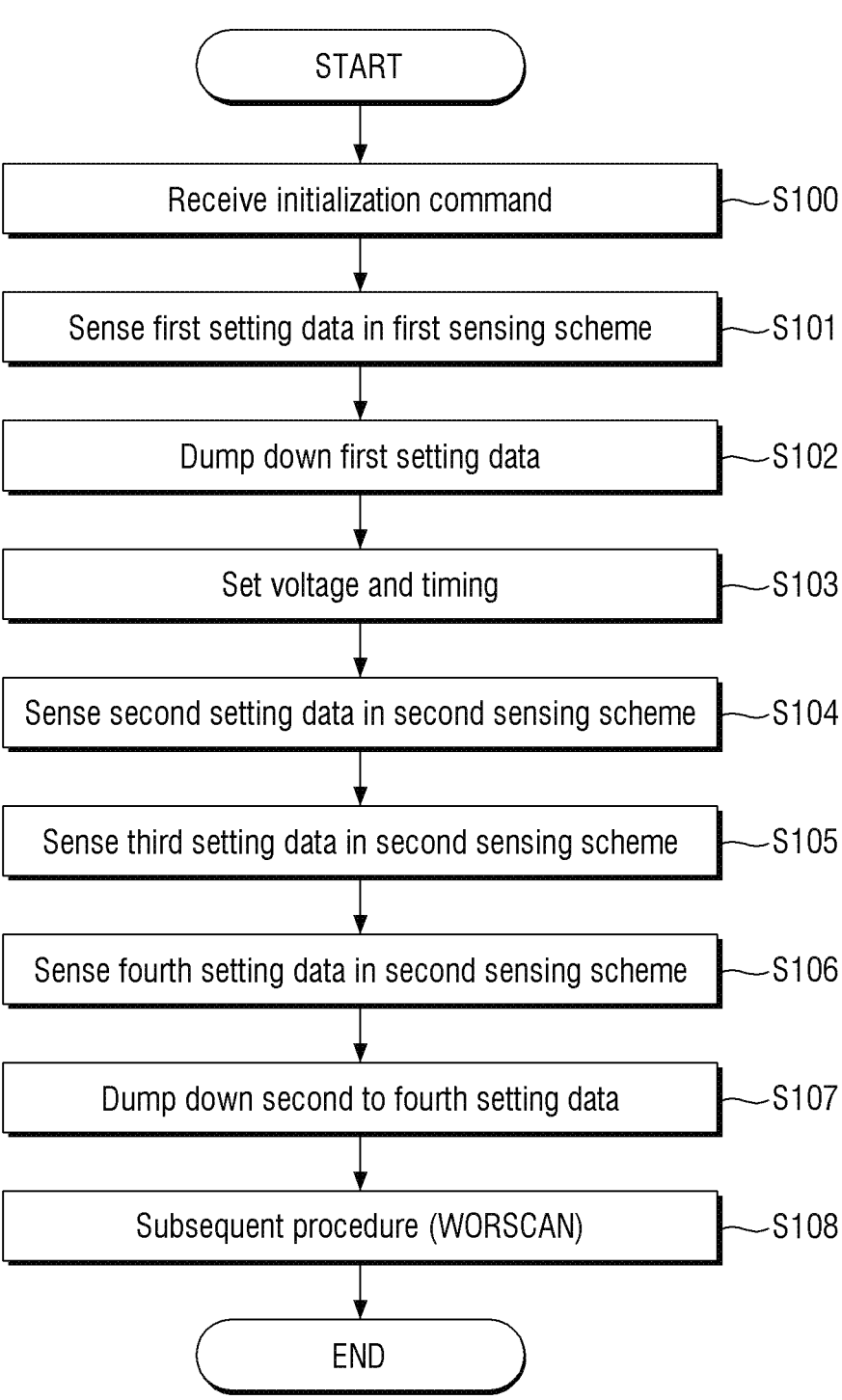
FIG. 5 is a flowchart showing a method of controlling initialization of a nonvolatile memory device according to some embodiments.

FIG. 5 is a flowchart showing a method of controlling initialization of a nonvolatile memory device according to some embodiments.

In an embodiment, first setting data may be stored in the first mat MAT1, second setting data may be stored in the second mat MAT2, third setting data may be stored in the third mat MAT3, and fourth setting data may be stored in the fourth mat MAT4. However, each of the number of the setting data and the number of the mats is not limited to a specific number, and FIG. 5 is only an example. This is equally applied to embodiments as described below.

Referring to FIG. 5, an initialization command is received in operation S100. For example, the control logic circuit 110 may receive an initialization command CMD through the memory interface circuit 170.

The first setting data is sensed in a first sensing scheme in operation S101. For example, the first sensing scheme may be voltage sensing. The page buffer circuit 120 may sense the first setting data stored in the first mat MAT1 using the first sensing scheme and temporarily store the sensed first setting data into the page buffer circuit 120.

The first setting data is dumped down in operation S102. For example, the first setting data stored inside the page buffer circuit 120 may include the trim information about the sensing speed (e.g., the trim information utilized for current sensing as described above). The page buffer circuit 120 may transmit the first setting data to the control logic circuit 110. The first setting data may be subjected to a verification process of data validity and then may be dumped down into the setting buffer 160 through the control logic circuit 110.

If a fail occurs in the validity verification operation of the setting data, the same sensing operation and dump-down operation may be repeated using first replica setting data stored in another memory area, for example, another mat. Like the first setting data, the first replica setting data may include the trim information about the sensing speed (for example, the trim information utilized for current sensing as described above). Like the first setting data, the first replica setting data may be dumped down to the setting buffer 160 through the control logic circuit 110 after going through a verification process for the validity of the data.

The voltage and the timing are set in operation S103. For example, in consideration of the trim information included in the dumped-down first setting data, the control logic circuit 110 may transmit the voltage generator control signal VCTL to the voltage generator 150, and may transmit the buffer control signal PCTL to the page buffer circuit 120. The voltage generator 150 may receive the voltage generator control signal VCTL and set a specific word line voltage and a specific voltage application timing for sensing in the second sensing scheme, based on the received voltage generator control signal VCT. The second sensing scheme may be current sensing.

The second setting data is sensed using the second sensing scheme in operation S104. For example, the second sensing scheme may be current sensing. The page buffer circuit 120 may sense the second setting data stored in the second mat MAT2 using the second sensing scheme and temporarily store the sensed second setting data into the page buffer circuit 120.

The third setting data is sensed using the second sensing scheme in operation S105. For example, the page buffer circuit 120 may sense the third setting data stored in the third mat MAT3 using the second sensing scheme and temporarily store the sensed third setting data into the page buffer circuit 120.

The fourth setting data is sensed using the second sensing scheme in operation S106. For example, the page buffer circuit 120 may sense the fourth setting data stored in the fourth mat MAT4 using the second sensing scheme and temporarily store the sensed forth setting data into the page buffer circuit 120.

The setting data temporarily stored in the page buffer circuit is dumped down in operation S107. For example, the page buffer circuit 120 may transmit the second to fourth setting data temporarily stored in the page buffer circuit 120 to the control logic circuit 110. The second to fourth setting data may be dumped down to the setting buffer 160 through the control logic circuit 110. Each dump-down operation may be accompanied by a validity verification operation of the setting data. If a fail occurs in the validity verification of the setting data, the same sensing operation and dump-down operation in operation S101 to operation S107 may be repeated using the first to fourth replica setting data stored in another memory area, for example, another mat.

A subsequent procedure is performed, and then the initialization process ends in operation S108. The subsequent procedure may include setting the level of the operating voltages and a WORscan operation of excluding the buffer of the defective column from the pass/fail operation.

Figure 6:
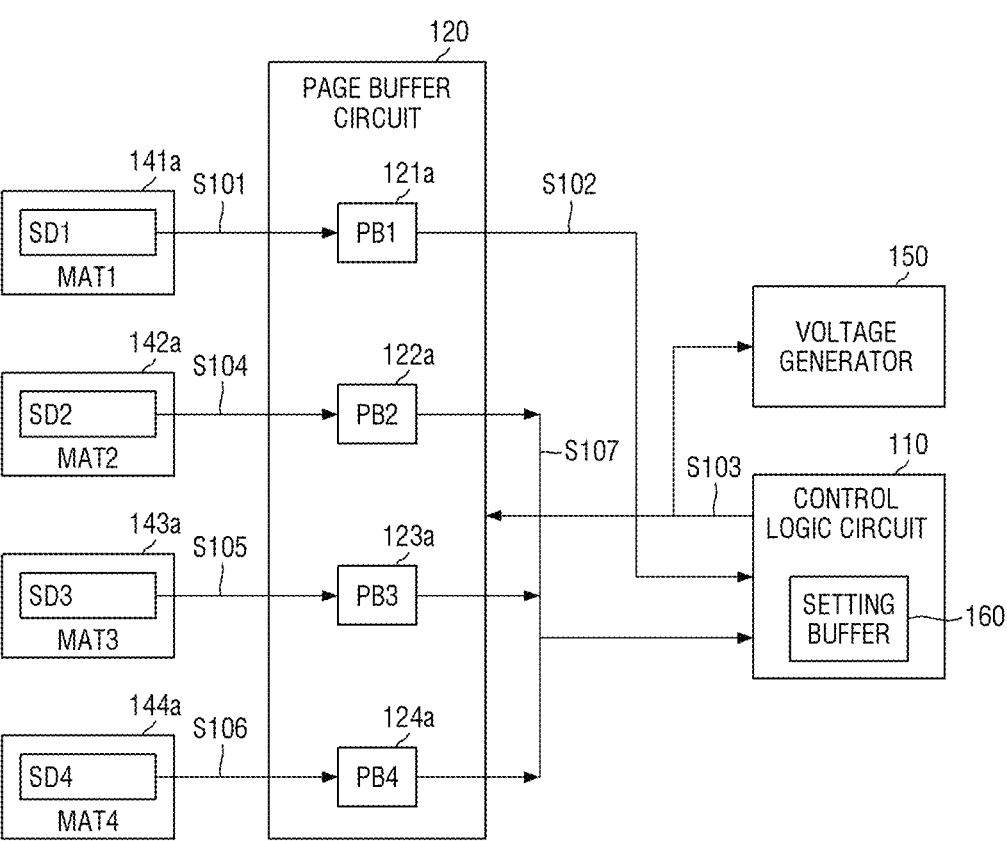
FIG. 6 is a block diagram showing the flow of data according to the flowchart of FIG. 5.

FIG. 6 is a block diagram showing the flow of data according to the flowchart of FIG. 5.

In an embodiment, the first setting data SD1 may be stored in a first mat 141a of the memory cell array 140, the second setting data SD2 may be stored in a second mat 142a thereof, the third setting data SD3 may be stored in a third mat 143a thereof, and the fourth setting data SD4 may be stored in a fourth mat 144a thereof. The page buffer circuit 120 may include a plurality of page buffers 121a to 124a. The first to fourth page buffers 121a to 124a may correspond to the first to fourth mats 141a to 144a, respectively. However, the number of page buffers is not limited to a specific number, and FIG. 6 is only an example. This is equally applied to embodiments as described below.

The first setting data SD1 stored in the first mat 141a may be temporarily stored in the first page buffer 121a in the first sensing scheme in operation S101. The first setting data temporarily stored in the first page buffer 121a may be dumped down to the setting buffer 160 through the control logic circuit 110 in operation S102. The first setting data includes the trim information about the sensing speed (for example, the trim information for sensing in the current sensing manner).

In consideration of the trim information dumped down into the setting buffer 160, the control logic circuit 110 may transmit the voltage generator control signal VCTL to the voltage generator 150 and may transmit the page buffer control signal PCTL to the page buffer circuit 120. The voltage generator 150 and the page buffer circuit 120 may set a specific voltage and a specific voltage application timing for sensing in the second sensing scheme, based on the received signal in operation S103. The second sensing scheme may be a current sensing scheme.

The second setting data SD2 stored in the second mat 142a may be sensed in the second sensing scheme and the sensed second setting data SD2 may be temporarily stored in the second page buffer 122a in operation S104. The third setting data SD3 stored in the third mat 143a may be sensed in the second sensing scheme and the sensed third setting data SD2 may be temporarily stored in the third page buffer 123a in operation S105. The fourth setting data SD4 stored in the fourth mat 144a may be sensed in the second sensing scheme and the sensed fourth setting data SD4 may be temporarily stored in the fourth page buffer 124a in operation S106. The second to fourth setting data temporarily stored in the second to fourth page buffers 122a to 124a, respectively may be dumped down to the setting buffer 160 through the control logic circuit 110 in operation S107.

Figure 7:
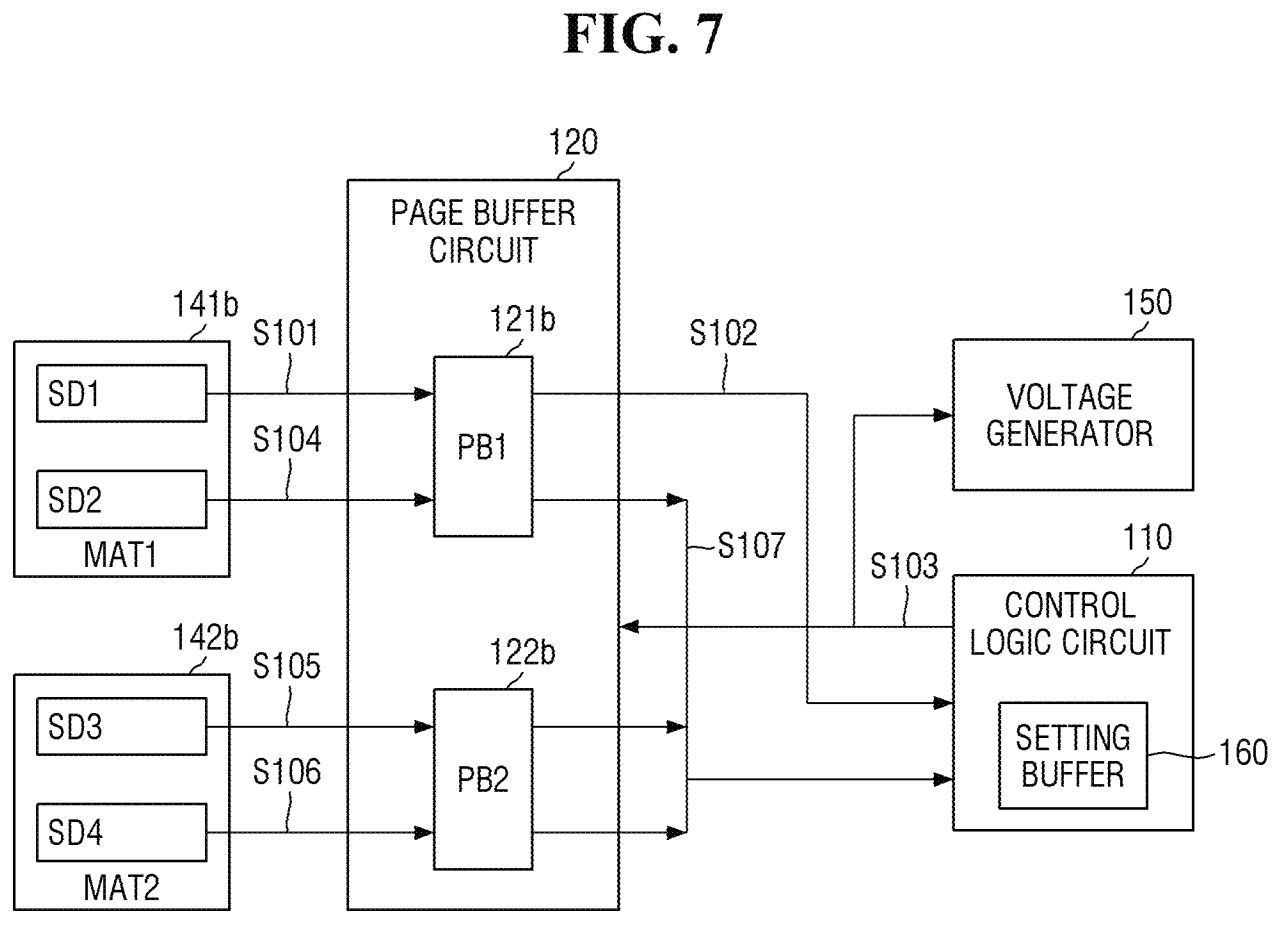

FIG. 7 is a block diagram showing the flow of data according to some embodiments.

In an embodiment, a sequence of operations of the method of controlling the initialization is the same as that in FIG. 6. However, unlike FIG. 6, in FIG. 7, the setting data may be stored only in some mats among the plurality of mats included in the memory cell array 140. In an embodiment described with reference to FIG. 7, it is described that the setting data are stored in two mats. However, this is merely an example, and the setting data may be stored in two or more mats.

The first setting data SD1 and the second setting data SD2 may be stored in the first mat 141b of the memory cell array 140. The third setting data SD3 and the fourth setting data SD4 may be stored in the second mat 142b. The page buffer circuit 120 may include a plurality of page buffers 121b and 122b. The first and second page buffers 121b and 122b may correspond to the first and second mats 141b and 142b, respectively. The first and second setting data SD1 and SD2 stored in the first mat 141b may be temporarily stored in the first page buffer 121b. The third and fourth setting data SD3 and SD4 stored in the second mat 142b may be temporarily stored in the second page buffer 122b. The data flow in FIG. 7 is the same as that in FIG. 6. Thus, for convenience of explanation a detailed description thereof is omitted.

Figure 8:
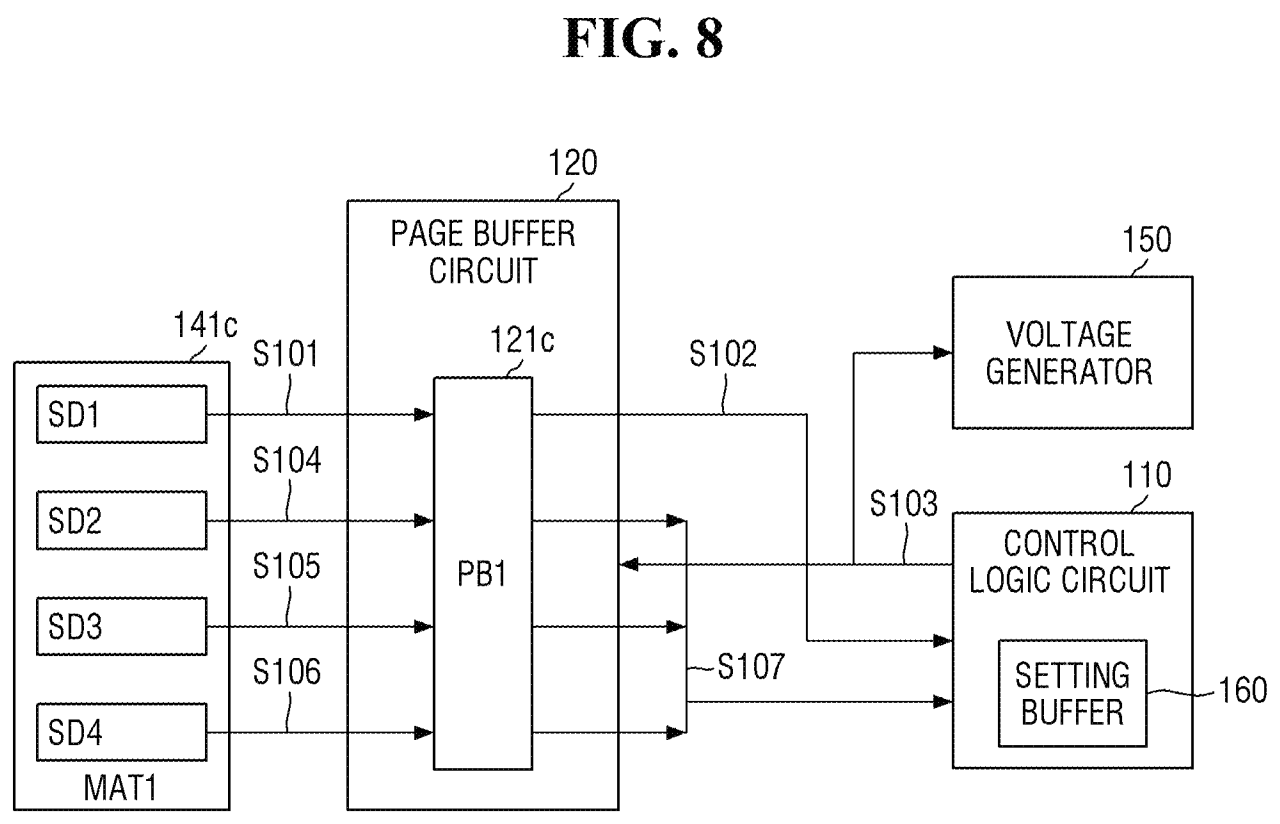

FIG. 8 is a block diagram showing the flow of data according to some embodiments.

In an embodiment, a sequence of operations of a method of controlling initialization is the same as that in each off FIG. 6 and FIG. 7. However, unlike FIG. 6 and FIG. 7, in FIG. 8, the setting data may be stored only in one mat among the plurality of mats included in the memory cell array 140.

The first setting data SD1 to the fourth setting data SD4 may be stored in the first mat 141c of the memory cell array 140. The page buffer circuit 120 may include the first page buffer 121c. The first page buffer 121c may correspond to the first mat 141c. The first to fourth setting data SD1 to SD4 stored in the first mat 141c may be temporarily stored in the first page buffer 121c. The data flow in FIG. 8 is the same as that in each of FIG. 6 and FIG. 7. Thus, for convenience of explanation, a detailed description thereof is omitted.

Figure 9:
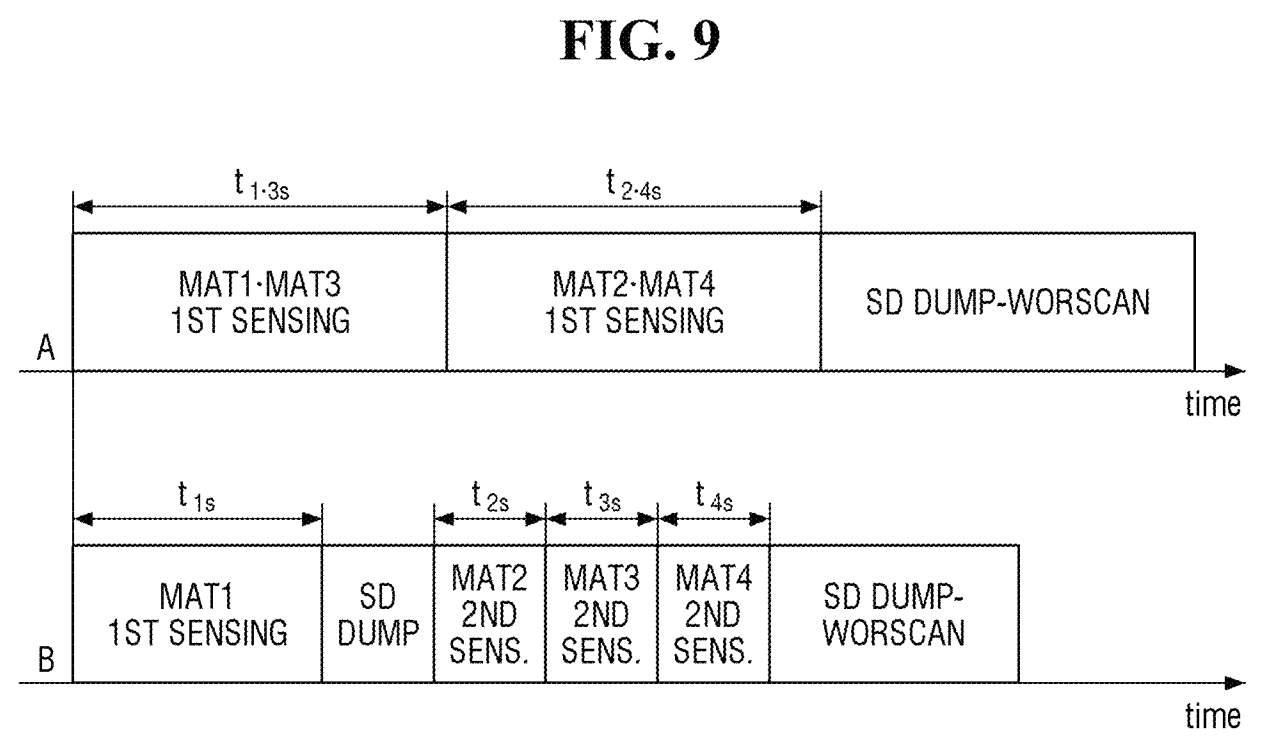

FIG. 9 is a diagram illustrating an effect of a method of controlling initialization of a nonvolatile memory device according to some embodiments.

Referring to FIG. 9, A is a timing diagram when the setting data stored in the plurality of mats are sensed simultaneously, unlike the previously described embodiment. B is a timing diagram of the initialization process according to the previously described embodiments.

Referring to A in FIG. 9, the setting information may be sensed only in the voltage sensing manner. To complete the setting data initialization process within a time limit, two mats may be sensed simultaneously (in a 2× speed sensing manner).

Referring to B in FIG. 9, the setting information may be sensed in both the voltage sensing and current sensing manners, as described above. All sensing operations may be performed in a 1× sensing speed manner in which each of the plurality of mats is not sensed simultaneously. In a first sensing, the voltage sensing scheme may be used, and the setting data including the trim information about the sensing speed, that is, the trim information utilized for sensing in the current sensing manner, may be dumped down first. The current sensing scheme may be used at a subsequent sensing in consideration of the dumped-down trim information.

When only the voltage sensing scheme is used, the time utilized for sensing the setting data in the 1× sensing speed manner in which each of the plurality of mats is not sensed simultaneously may be larger than the time utilized for sensing the setting data in the 2× speed sensing manner in which two mats may be sensed simultaneously. Since the time utilized for the initialization process affects a booting time, the time utilized for sensing the setting data is reduced.

According to some embodiments, the setting data including the trim information utilized for high-speed sensing in the current sensing scheme may be immediately dumped into the setting buffer 160 through the control logic circuit 110 via the voltage sensing. Subsequently, the high-speed sensing may be performed in consideration of the trim information, which may reduce the time utilized for the data sensing.

Referring to FIG. 9, the time utilized for the data sensing when the sensing in the voltage sensing scheme is performed twice at the 1× speed may be larger than that when the data sensing is performed once at the 2× speed (t13 s<2*t1 s). However, a total time utilized to sense the plurality of mats when the sensing at the 1× speed in the high-speed sensing scheme, that is, the current sensing scheme after sensing the data in the voltage sensing scheme, may be smaller than that when the data sensing is performed at the 2× speed in the voltage sensing manner (t1 s+t2 s+t3 s+t4 s<t13 s+t24 s).

An amount of power utilized in the process of simultaneously sensing the two mats in the double-speed (2× speed) sensing may be larger than that when only one mat is sensed in the 1× speed sensing. Due to the high integration of the memory device, it is desirable to lower a peak power used inside the memory device. The 1× speed sensing may be performed to lower the power consumption used in the initialization process of the nonvolatile memory device, such that the peak power may be lowered.

Figure 10:
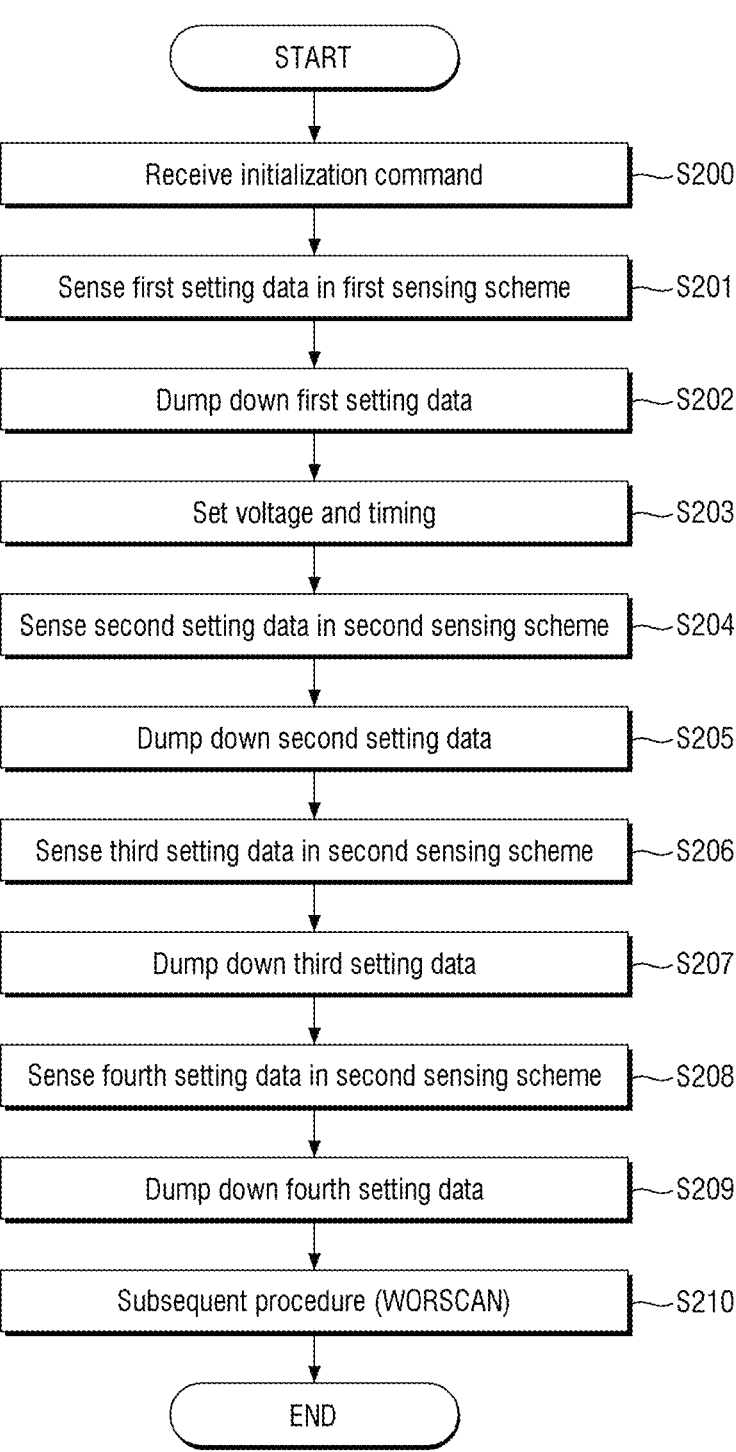
FIG. 10 is a flowchart showing a method of controlling initialization of a nonvolatile memory device according to some embodiments.

FIG. 10 is a flowchart showing a method of controlling initialization of a nonvolatile memory device according to some embodiments.

Unlike FIG. 5, in FIG. 10, the setting data may be temporarily stored in the page buffer circuit 120, and then next setting data may not be sensed, but the temporarily stored setting data may be immediately dumped down, and then the next setting data may be sensed.

Referring to FIG. 10, the process up to sensing the second setting data in the second sensing scheme in in S204 is the same as that in FIG. 5. For example, operation S200 may correspond to operation S100, operation S201 may correspond to operation S101, operation S202 may correspond to operation S102, operation S203 may correspond to operation S103, and operation S204 may correspond to operation S104.

The second setting data temporarily stored in the page buffer circuit 120 may be dumped down in operation S205. For example, the page buffer circuit 120 may transmit the second setting data temporarily stored in the page buffer circuit 120 to the control logic circuit 110. The second setting data may be subjected to the data validity verification process and then may be dumped down into the setting buffer 160 through the control logic circuit 110.

The third setting data is sensed in the second sensing scheme in operation S206. Subsequently, the third setting data is dumped down in operation S207. Specific operations thereof may be the same as sensing and dumping down the second setting data. Thus, for convenience of explanation, detailed descriptions thereof are omitted.

The fourth setting data is sensed in the second sensing scheme in operation S208. Subsequently, the fourth setting data is dumped down in operation S209. Specific operations thereof may be the same as sensing and dumping down each of the second setting data and the third setting data. Thus, for convenience of explanation, detailed descriptions thereof are omitted.

As described above, each dump-down operation may be accompanied by a validity verification operation of the setting data. If a fail occurs in the validity verification of the setting data, the same sensing operation and dump-down operation in operation S201 to operation S209 may be repeated using the replica setting data stored in another memory area.

A subsequent procedure is performed, and then the initialization process ends in operation S210. The subsequent procedure may include setting the level of the operating voltages and the WORscan operation of excluding the buffer of the defective column from the pass/fail operation.

Each of the plurality of page buffers included in the page buffer circuit 120 may include a latch circuit that temporarily stores read-out data therein. The setting data may be sensed and then the sensed setting data may be temporarily stored in the latch circuit inside the page buffer.

Referring to FIG. 7 and FIG. 8, the plurality of setting data may be stored in one page buffer. Less latch circuits inside the page buffer may be used when the setting data are temporarily stored in one page buffer, and then the setting data temporarily stored therein may be immediately dumped down without sensing the next setting data than when all of the plurality of setting data are sensed and then dumped down at once.

Figure 11:
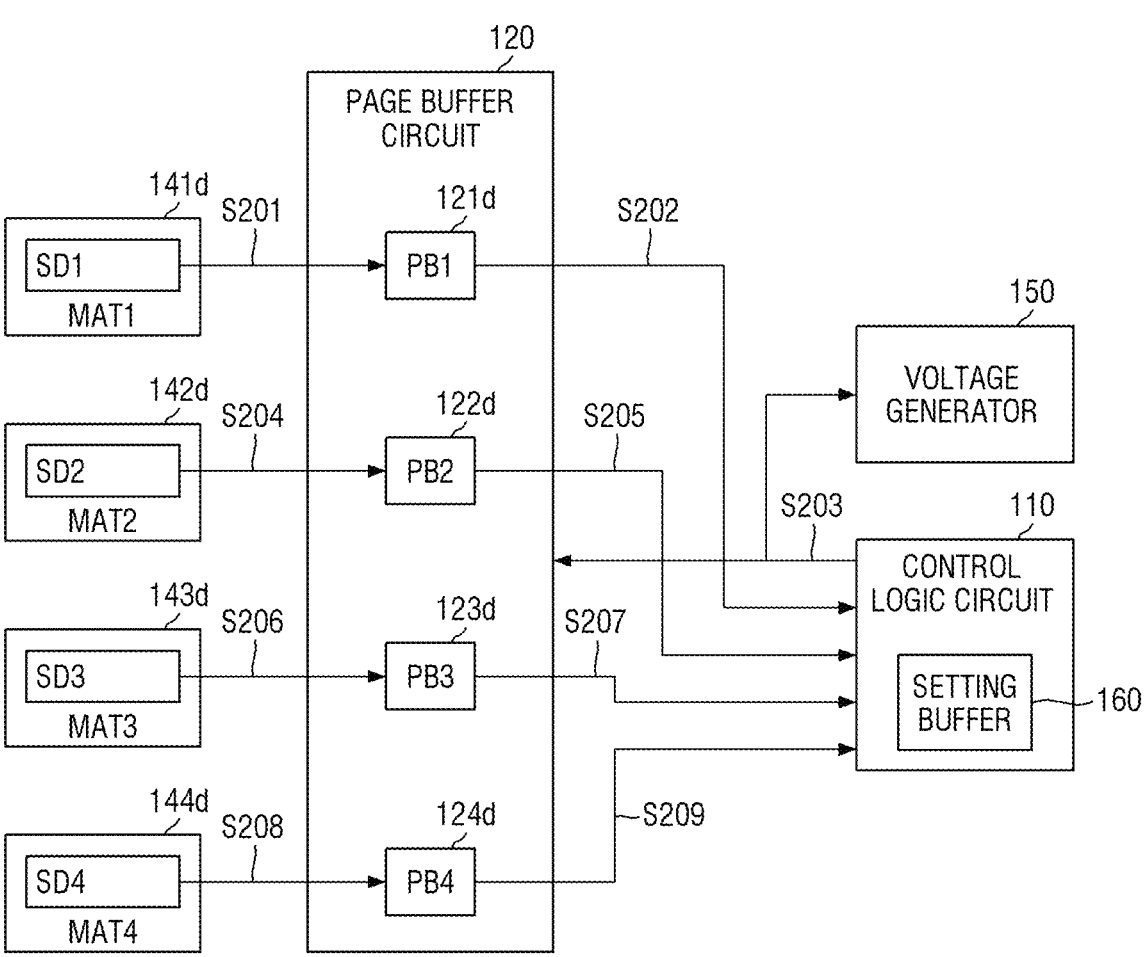
FIG. 11 is a block diagram showing the flow of data according to the flowchart of FIG. 10.

FIG. 11 is a block diagram showing the flow of data according to the flowchart of FIG. 10.

Referring to FIG. 11, the process up to temporarily storing the second setting data SD stored in the second mat 142d of the memory cell array 140 in the second page buffer 122d using the first sensing scheme in S204 is the same as that in FIG. 6. The page buffer circuit may include a plurality of page buffers 121d to 124d. The first to fourth page buffers 121d to 124d may correspond to the first to fourth mats 141d to 144d.

Unlike FIG. 6, the method described with reference to FIG. 11 may not sense the third setting data SD stored in the third mat 143d, but may first dump down the second setting data temporarily stored in the second page buffer 122d into the setting buffer through the control logic circuit 110 in operation S205.

The third setting data SD stored in the third mat 143d may be temporarily stored in the third page buffer 123d in the second sensing scheme in operation S206. The third setting data temporarily stored therein may be dumped down to the setting buffer through the control logic circuit 110 in operation S207. This is equally applied to the fourth setting data in operation S208 and operation S209.

Figure 12:
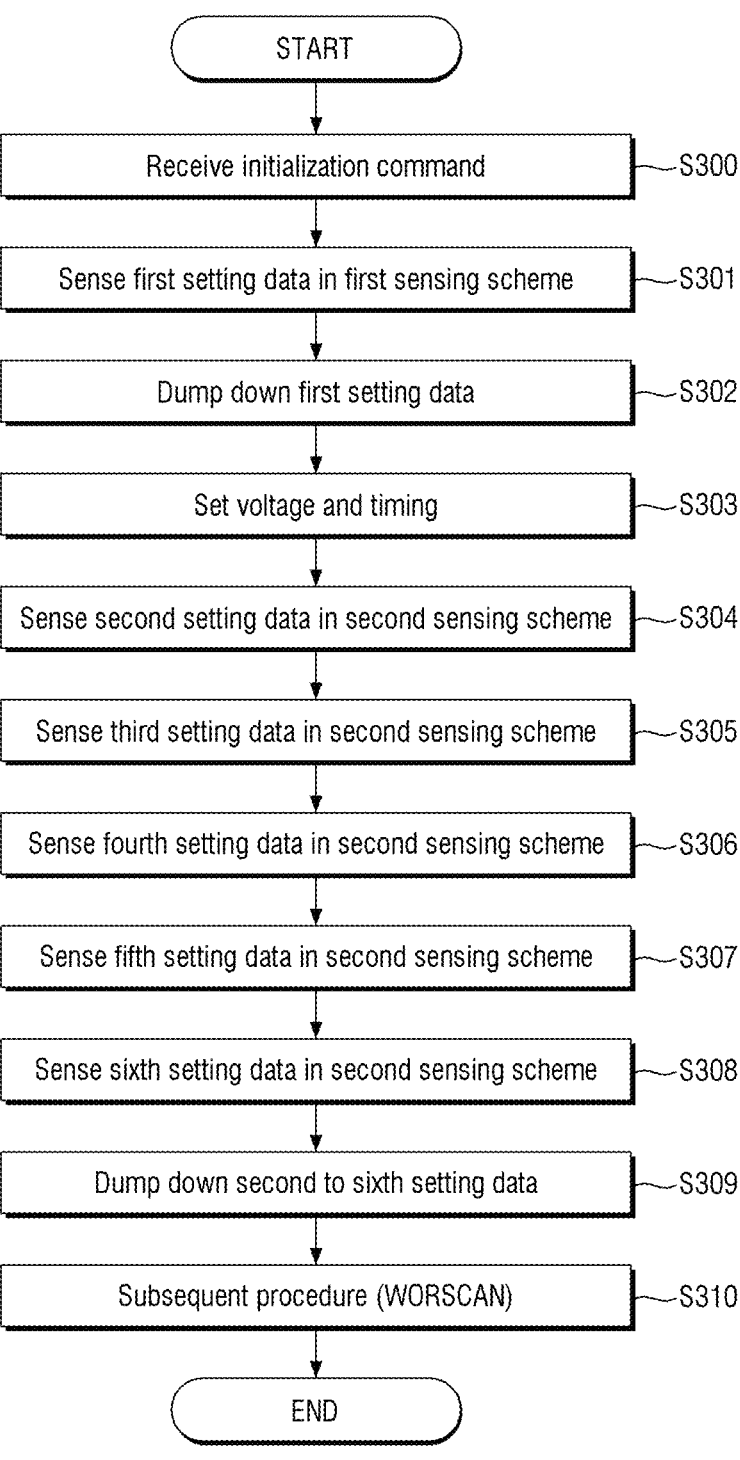
FIG. 12 is a flowchart showing a method of controlling initialization of a nonvolatile memory device according to some embodiments.

FIG. 12 is a flowchart showing a method of controlling initialization of a nonvolatile memory device according to some embodiments.

Unlike FIG. 5, in FIG. 12, the memory cell array 140 may include the first mat to a sixth mat. The fifth setting data may be stored in a fifth mat MAT5, and sixth setting data may be stored in a sixth mat MAT6.

The process up to sensing the fourth setting data in the second sensing scheme in in operation S306 is the same as that in FIG. 5. For example, operation S300 may correspond to operation S100, operation S301 may correspond to operation S101, operation S302 may correspond to operation S102, operation S303 may correspond to operation S103, operation S304 may correspond to operation S104, operation S305 may correspond to operation S105, and operation S306 may correspond to operation S106.

The fifth setting data is sensed using the second sensing scheme in operation S307. For example, the page buffer circuit 120 may sense the fifth setting data stored in the fifth mat MAT5 using the second sensing scheme and temporarily store the second fifth setting data into the page buffer circuit 120. The sixth setting data is sensed using the second sensing scheme in operation S308. A specific operation thereof may be the same as sensing the fifth setting data in operation S307. Thus, for convenience of explanation, detailed descriptions thereof are omitted.

The setting data temporarily stored in the page buffer circuit is dumped down in operation S309. For example, the page buffer circuit 120 may transmit the second to sixth setting data temporarily stored in the page buffer circuit 120 to the control logic circuit 110. The second to sixth setting data may be dumped down into the setting buffer 160 through the control logic circuit 110.

As described above, each dump-down operation may be accompanied by a validity verification operation of the setting data. If a fail occurs in the validity verification of the setting data, the same sensing operation and dump-down operation in operation S301 to operation S309 may be repeated using the replica setting data stored in another memory area.

A subsequent procedure is performed, and then the initialization process ends in operation S210. The subsequent procedure may include setting the level of the operating voltages and the WORscan operation of excluding the buffer of the defective column from the pass/fail operation.

Figure 13:
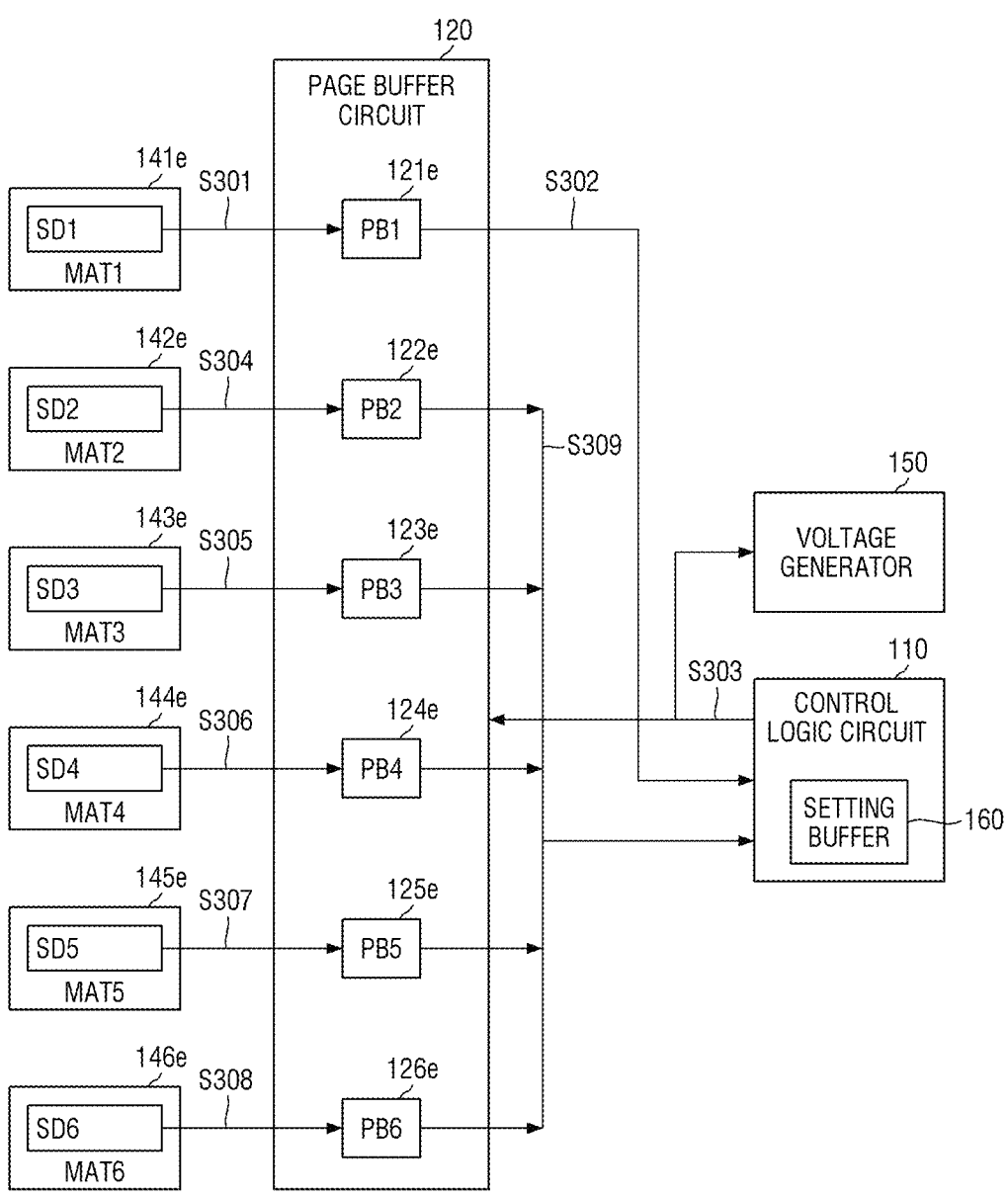
FIG. 13 is a block diagram showing the flow of data according to the flowchart of FIG. 12.

FIG. 13 is a block diagram showing the flow of data according to the flowchart of FIG. 12.

Unlike FIG. 6, in FIG. 13, the fifth setting data SD5 may be stored in the fifth mat 145e of the memory cell array 140, and the sixth setting data SD6 may be stored in the sixth mat 146e thereof. The page buffer circuit 120 may include a plurality of page buffers 121e to 126e. The first to sixth page buffers 121e to 126e may correspond to the first to sixth mats 141e to 146e, respectively. The data flow in FIG. 13 is the same as that in FIG. 6. Thus, for convenience of explanation, detailed descriptions thereof are omitted.

Figure 14:
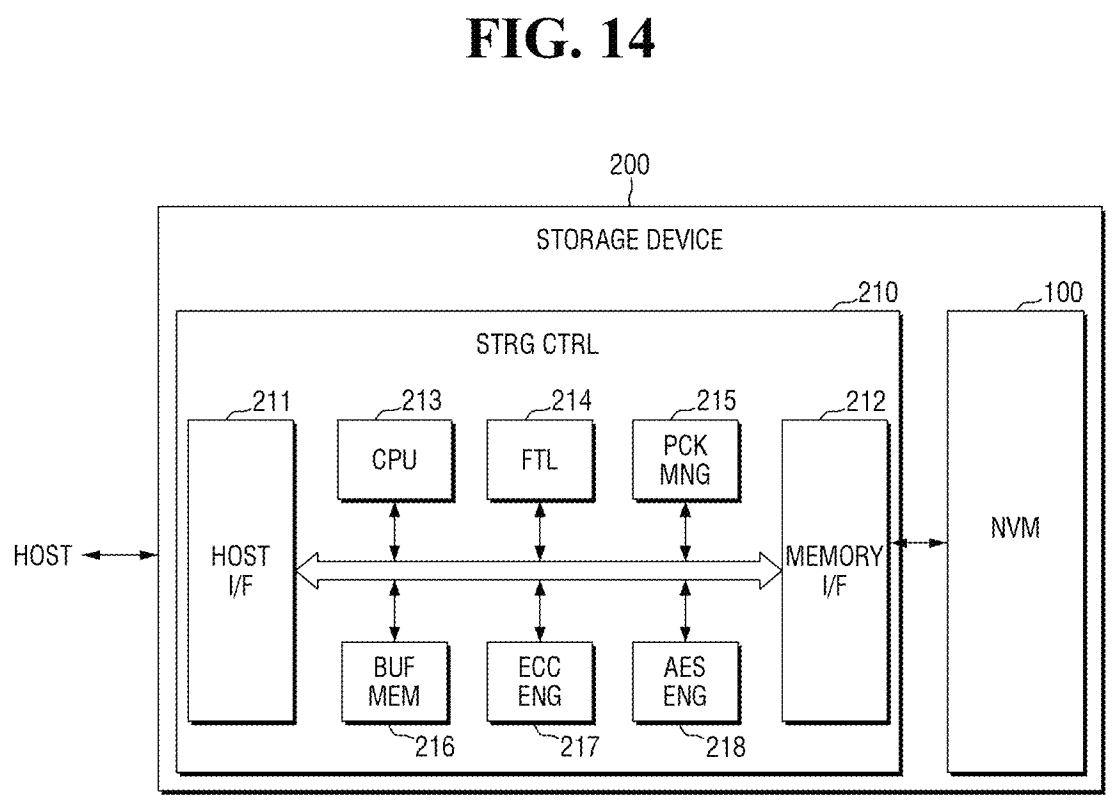

FIG. 14 is a block diagram of a storage device including a nonvolatile memory device according to some embodiments.

Referring to FIG. 14, a storage device 200 may include a storage controller 210 and the nonvolatile memory device (NVM) 100. The nonvolatile memory device (NVM) 100 as shown in FIG. 14 may be the same as the nonvolatile memory device 100 as shown in FIG. 1 and FIG. 2. The storage device may include storage media for storing data therein in response to a request from a host. In an example, the storage device 200 may include at least one of a solid state drive (SSD), an embedded memory, and a removable external memory. When the storage device 200 is embodied as the SSD, the storage device 200 may be a device that is configured to comply with a NVMe (non-volatile memory express) standard. When the storage device 200 is embodied as the embedded memory or the external memory, the storage device 200 may be a device that is configured to comply with a universal flash storage (UFS) standard or an embedded multi-media card (eMMC) standard. Each of the host and the storage device 200 may generate and transmit a packet according to an adopted standard protocol thereof.

When the nonvolatile memory device 100 of the storage device 200 include a flash memory, the flash memory may include a 2D NAND memory array or a 3D (or vertical) NAND (VNAND) memory array. In an example, the storage device 200 may include various other types of non-volatile memories. For example, the storage device 200 may include magnetic RAM (MRAM), spin-transfer torque MRAM, conductive bridging RAM (CBRAM), ferroelectric RAM (FeRAM), phase RAM (PRAM), resistive RAM, and various other types of memories.

The storage controller 210 may include a host interface 211, a storage-memory interface 212, and a central processing unit (CPU) 213. Furthermore, the storage controller 210 may further include a flash translation layer (FTL) 214, a packet manager 215, a buffer memory 216, an error correction code (ECC) engine 217, and an advanced encryption standard (AES) engine 218. The storage controller 210 may further include a working memory into which the flash conversion layer (FTL) 214 is loaded. The CPU 213 may execute the FTL to control data writing and read-out operations into and from the non-volatile memory 220.

For example, the storage device 200 may receive a storage device driving signal from the host through the host interface 211. The CPU 213 may transmit the initialization command in response to the storage device driving signal. The initialization command may be transmitted to the control logic circuit 110 of the nonvolatile memory device 100 through the storage-memory interface 212.

The host interface 211 may transmit and receive the packet to and from the host. The packet transmitted from the host to the host interface 211 may include a command or data to be written to the nonvolatile memory device 100. The packet transmitted from the host interface 211 to the host may include a response to the command, or the data read-out from the nonvolatile memory device 100. The storage-memory interface 212 may transmit the data to be written to the nonvolatile memory device 100 thereto or receive the data read-out from the nonvolatile memory device 100 therefrom. This storage-memory interface 212 may be configured to comply with a standard protocol such as Toggle or ONFI (Open NAND Flash Interface).

The FTL 214 may perform several functions such as, for example, address mapping, wear-leveling, and garbage collection. The address mapping operation may refer to an operation of converting a logical address received from the host into a physical address used to actually store data in the non-volatile memory device 100. The wear-leveling may refer to a scheme to ensure that blocks in the non-volatile memory device 100 are used uniformly to prevent excessive degradation of a specific block. For example, the wear-leveling may be implemented using firmware technology that balances erase counts of physical blocks. The garbage collection may refer to a scheme of copying valid data of a block to a new block and then erasing the former block to secure available capacity in the non-volatile memory device 100.

The packet manager 215 may generate the packet according to a protocol of an interface negotiated with the host or may parse various information from the packet received from the host. Furthermore, the buffer memory 216 may temporarily store the data to be written to the nonvolatile memory device 100 or the data to be read out from the nonvolatile memory device 100.

The buffer memory 216 may be provided within the storage controller 210, or may be disposed outside the storage controller 210.

The ECC engine 217 may perform an error detection and correction function on read-out data read from the non-volatile memory device 100. For example, the ECC engine 217 may generate parity bits for to-be-written data to be written into the non-volatile memory device 100. The generated parity bits together with the to-be-written data may be stored in the non-volatile memory device 100. When reading data from the non-volatile memory device 100, the ECC engine 217 may use the parity bits read from the non-volatile memory device 100 together with the read-out data to correct an error of the read-out data and output the corrected read-out data.

The AES engine 218 may perform at least one of encryption and decryption operations on data to be input to the storage controller 210 using a symmetric-key algorithm.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

In some embodiments of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present disclosure, the 3D memory array includes vertical NAND strings that are vertically oriented such that at least one memory cell is located over another memory cell. The at least one memory cell may include a charge trap layer.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A nonvolatile memory device, comprising:
a memory cell array configured to store first setting data and second setting data;
a page buffer circuit configured to store data of the memory cell array; and
a control logic circuit configured to:
control a sensing operation based on setting data stored in a setting buffer;

perform first sensing of the first setting data stored in the memory cell array in a first sensing scheme, and store the sensed first setting data in the page buffer circuit;
dump down the first setting data stored in the page buffer circuit into the setting buffer; and
perform second sensing of the second setting data stored in the memory cell array in a second sensing scheme different from the first sensing scheme based on the first setting data dumped down into the setting buffer, and store the sensed second setting data in the page buffer circuit.

2. The nonvolatile memory device of claim 1, wherein the first sensing scheme includes voltage sensing, and the second sensing scheme includes current sensing.

3. The nonvolatile memory device of claim 1, wherein the first setting data includes trim information about a sensing speed.

4. The nonvolatile memory device of claim 3, wherein the trim information about the sensing speed includes at least one of trim information about voltage setting, trim information about sensing timing, and trim information about column repair.

5. The nonvolatile memory device of claim 1, wherein a sensing speed in the second sensing scheme is greater than a sensing speed in the first sensing scheme.

6. The nonvolatile memory device of claim 1, wherein the memory cell array includes a plurality of mats in which the first setting data and the second setting data are stored,
wherein when the first and second setting data are sensed, the plurality of mats are not sensed simultaneously.

7. The nonvolatile memory device of claim 1, wherein the memory cell array includes a first mat configured to store the first setting data and the second setting data,
wherein the page buffer circuit includes a first page buffer configured to store data of the first mat,
wherein the control logic circuit is further configured to:
perform the first sensing of the first setting data stored in the first mat in the first sensing scheme and store the sensed first setting data in the first page buffer; and
perform the second sensing of the second setting data stored in the first mat in the second sensing scheme and store the sensed second setting data in the first page buffer.

8. The nonvolatile memory device of claim 1, wherein the memory cell array includes:
a first mat configured to store the first setting data; and
a second mat configured to store the second setting data,
wherein the page buffer circuit includes:
a first page buffer configured to store data of the first mat; and
a second page buffer configured to store data of the second mat,
wherein the control logic circuit is further configured to:
perform the first sensing of the first setting data stored in the first mat in the first sensing scheme and store the sensed first setting data in the first page buffer; and
perform the second sensing of the second setting data stored in the second mat in the second sensing scheme and store the sensed second setting data in the second page buffer.

9. The nonvolatile memory device of claim 8, wherein the memory cell array further includes a third mat configured to store third setting data,
wherein the page buffer circuit further includes a third page buffer configured to store data of the third mat, wherein the control logic circuit is further configured to:

perform the first sensing of the first setting data stored in the first mat in the first sensing scheme and store the sensed first setting data in the first page buffer;

perform the second sensing of the second setting data stored in the second mat in the second sensing scheme and store the sensed second setting data in the second page buffer;

perform third sensing of the third setting data stored in the third mat in the second sensing scheme and store the sensed third setting data in the third page buffer; and dump down the second setting data stored in the second page buffer and the third setting data stored in the third page buffer into the setting buffer.

10. The nonvolatile memory device of claim 8, wherein the memory cell array further includes a third mat configured to store third setting data, wherein the page buffer circuit further includes a third page buffer configured to store data of the third mat, wherein the control logic circuit is further configured to:

perform the first sensing of the first setting data stored in the first mat in the first sensing scheme and store the sensed first setting data in the first page buffer;

perform the second sensing of the second setting data stored in the second mat in the second sensing scheme and store the sensed second setting data in the second page buffer;

dump down the second setting data stored in the second page buffer into the setting buffer;

perform third sensing of the third setting data stored in the third mat in the second sensing scheme and store the sensed third setting data in the third page buffer; and dump down the third setting data stored in the third page buffer into the setting buffer.

11. A method of controlling initialization of a nonvolatile memory device, the method comprising:

selecting a first sensing scheme;

performing first sensing of first setting data stored in a memory cell array in the first sensing scheme, and storing the sensed first setting data in a first page buffer;

dumping down the first setting data stored in the first page buffer into a setting buffer;

selecting a second sensing scheme different from the first sensing scheme based on the first setting data dumped down into the setting buffer; and performing second sensing of second setting data stored in the memory cell array in the second sensing scheme and storing the sensed second setting data in a second page buffer.

12. The method of claim 11, wherein the dumping down of the first setting data stored in the first page buffer into the setting buffer includes:

verifying validity of the first setting data stored in the first page buffer;

in response to a fail occurring when verifying the validity, performing third sensing of first replica setting data stored in the memory cell array in the first sensing scheme and storing the sensed first replica setting data in the first page buffer; and dumping down the first replica setting data stored in the first page buffer into the setting buffer.

13. The method of claim 11, wherein the first sensing scheme includes voltage sensing, and the second sensing scheme includes current sensing.

14. The method of claim 11, wherein the first setting data includes trim information about a sensing speed.

15. The method of claim 14, wherein the trim information includes at least one of trim information about voltage setting, trim information about sensing timing, and trim information about column repair.

16. The method of claim 11, wherein a sensing speed in the second sensing scheme is greater than a sensing speed in the first sensing scheme.

17. The method of claim 11, wherein the memory cell array includes a plurality of mats in which the first setting data and the second setting data are stored, wherein when the first and second setting data are sensed, the plurality of mats are not sensed simultaneously.

18. The method of claim 11, wherein the memory cell array includes:

a first mat storing the first setting data; and a second mat storing the second setting data, wherein the first page buffer and the second page buffer are different from each other.

19. The method of claim 18, wherein the memory cell array further includes a third mat storing third setting data, wherein the method further comprises:

performing third sensing of the third setting data stored in the third mat in the second sensing scheme and storing the sensed third setting data in a third page buffer; and dumping down the second setting data in the second page buffer and the third setting data stored in the third page buffer into the setting buffer.

20. A storage device, comprising:

a nonvolatile memory device; and a storage controller configured to transmit an initialization command to the nonvolatile memory device, wherein the nonvolatile memory device includes:

a memory cell array in which first setting data and second setting data are stored; and a control logic circuit configured to:

control a sensing operation based on setting data stored in a setting buffer;

in response to the initialization command, perform first sensing of the first setting data stored in the memory cell array in a first sensing scheme; and perform second sensing of the second setting data stored in the memory cell array in a second sensing scheme different from the first sensing scheme based on the sensed first setting data.

* * * * *